(12) United States Patent
Guo et al.

(10) Patent No.: US 12,402,348 B2
(45) Date of Patent: Aug. 26, 2025

(54) FIELD EFFECT TRANSISTOR WITH SELECTIVE CHANNEL LAYER DOPING

(71) Applicant: Wolfspeed, Inc., Durham, NC (US)

(72) Inventors: Jia Guo, Apex, NC (US); Saptharishi Sriram, Cary, NC (US); Scott Sheppard, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 258 days.

(21) Appl. No.: 17/325,610

(22) Filed: May 20, 2021

(65) Prior Publication Data

US 2022/0376105 A1 Nov. 24, 2022

(51) Int. Cl.
*H01L 29/778* (2006.01)
*H01L 21/76* (2006.01)
(Continued)

(52) U.S. Cl.
CPC ..... *H10D 30/4755* (2025.01); *H01L 21/7605* (2013.01); *H01L 21/765* (2013.01);
(Continued)

(58) Field of Classification Search
CPC ............. H01L 29/7787; H01L 21/7605; H01L 21/765; H01L 29/2003; H01L 29/404; H01L 29/66462; H01L 2223/6611; H01L 23/10; H01L 23/36; H01L 23/4334; H01L 23/66; H01L 29/36; H01L 29/1075; H01L 29/402; H01L 29/42316; H01L 2223/6683; H01L 2224/32245; H01L 2224/48247; H01L 2224/73265; H01L 2924/19107; H01L 29/7786
See application file for complete search history.

(56) References Cited

U.S. PATENT DOCUMENTS 4,958,213 A * 9/1990 Eklund ............... H01L 21/8249
257/378
5,132,752 A * 7/1992 Umemoto ............. H01L 29/812
257/E29.317
(Continued)

FOREIGN PATENT DOCUMENTS

JP 2003109973 A 4/2003
JP 2010199409 A * 9/2010
(Continued)

OTHER PUBLICATIONS

PCT International Search Report and Written Opinion for International Application No. PCT/US22/20907 mailed Dec. 6, 2022, 18 pages.
(Continued)

*Primary Examiner* — Eva Y Montalvo
*Assistant Examiner* — Pratiksha Jayant Lohakare
(74) *Attorney, Agent, or Firm* — Sage Patent Group

(57) ABSTRACT

A transistor device according to some embodiments includes a channel layer, a barrier layer on the channel layer, and source and drain contacts on the barrier layer, and a gate contact on the barrier layer between the source and drain contacts. The channel layer includes a sub-layer having an increased doping concentration level relative to a remaining portion of the channel layer. The presence of the sub-layer may reduce drain lag without substantially increasing gate lag.

21 Claims, 14 Drawing Sheets

(51) Int. Cl.
*H01L 21/765* (2006.01)
*H01L 29/20* (2006.01)
*H10D 30/01* (2025.01)
*H10D 30/47* (2025.01)
*H10D 62/85* (2025.01)
*H10D 64/00* (2025.01)

(52) U.S. Cl.
CPC ....... *H10D 30/015* (2025.01); *H10D 62/8503* (2025.01); *H10D 64/112* (2025.01)

(56) References Cited

U.S. PATENT DOCUMENTS

| | | | | |
|---|---|---|---|---|
| 5,569,937 | A * | 10/1996 | Bhatnagar | H01L 29/1608 257/493 |
| 5,889,315 | A * | 3/1999 | Farrenkopf | H01L 29/7833 257/552 |
| 6,849,882 | B2 | 2/2005 | Chavarkar et al. | |
| 7,126,426 | B2 | 10/2006 | Mishra et al. | |
| 7,230,284 | B2 | 6/2007 | Parikh et al. | |
| 7,501,669 | B2 | 3/2009 | Parikh et al. | |
| 7,550,783 | B2 | 6/2009 | Wu et al. | |
| 7,573,078 | B2 | 8/2009 | Wu et al. | |
| 9,640,646 | B2 * | 5/2017 | Dewey | H10D 30/6757 |
| 9,847,411 | B2 | 12/2017 | Sriram et al. | |
| 10,892,356 | B2 | 1/2021 | Sriram et al. | |
| 10,971,612 | B2 | 4/2021 | Bothe et al. | |
| 2003/0027394 | A1* | 2/2003 | Toyama | H10D 30/4738 438/290 |
| 2003/0170938 | A1* | 9/2003 | Takahashi | H01L 27/1214 257/E27.111 |
| 2005/0082569 | A1* | 4/2005 | Toyama | H01L 21/28593 438/285 |
| 2005/0224809 | A1* | 10/2005 | Sriram | H01L 29/66068 257/77 |
| 2005/0253167 | A1 | 11/2005 | Wu et al. | |
| 2006/0202272 | A1* | 9/2006 | Wu | H01L 29/404 257/E29.253 |
| 2006/0244011 | A1* | 11/2006 | Saxler | H10D 30/4732 257/E29.249 |
| 2007/0295992 | A1* | 12/2007 | Teraguchi | H10D 30/4755 257/E21.403 |
| 2008/0128752 | A1 | 6/2008 | Wu | |
| 2008/0179637 | A1* | 7/2008 | Henning | H01L 29/8128 257/E29.05 |
| 2010/0276698 | A1 | 11/2010 | Moore et al. | |
| 2012/0049973 | A1 | 3/2012 | Smith, Jr. et al. | |
| 2012/0194276 | A1 | 8/2012 | Fisher | |
| 2014/0130429 | A1* | 5/2014 | Livsey | E04D 1/2916 52/173.3 |
| 2014/0138743 | A1* | 5/2014 | Saeki | H10D 64/513 257/190 |
| 2014/0209922 | A1* | 7/2014 | Ota | H01L 29/7787 257/194 |
| 2014/0361342 | A1* | 12/2014 | Sriram | H01L 29/402 257/194 |
| 2015/0115323 | A1* | 4/2015 | Kawai | H01L 21/76895 438/270 |
| 2016/0225885 | A1* | 8/2016 | Takeuchi | H10D 62/824 |
| 2017/0092371 | A1* | 3/2017 | Harari | H10D 30/693 |
| 2017/0229550 | A1 | 8/2017 | Morvan | |
| 2018/0068161 | A1* | 3/2018 | Thompson | G06V 40/1312 |
| 2019/0221660 | A1* | 7/2019 | Dasgupta | H10D 30/475 |
| 2020/0312961 | A1* | 10/2020 | Then | H10D 30/475 |
| 2021/0111254 | A1* | 4/2021 | Jones | H01L 29/7786 |
| 2022/0130965 | A1 | 4/2022 | Bothe et al. | |
| 2022/0130985 | A1 | 4/2022 | Bothe et al. | |
| 2022/0367106 | A1 | 11/2022 | Lee et al. | |
| 2022/0376085 | A1 | 11/2022 | Bothe et al. | |
| 2022/0376098 | A1 | 11/2022 | Lee et al. | |
| 2022/0376099 | A1 | 11/2022 | Bothe et al. | |
| 2022/0376104 | A1 | 11/2022 | Bisges et al. | |

FOREIGN PATENT DOCUMENTS

| | | |
|---|---|---|
| JP | 2013084976 A | 5/2013 |
| JP | 2013207086 A | 10/2013 |
| JP | 2014187344 A | 10/2014 |
| JP | 2019519121 A | 7/2019 |

OTHER PUBLICATIONS

Korean Office Action dated Dec. 10, 2024 for Korean Patent Application No. 10-2023-7042192, 7 pages.
Japanese Office Action dated Jan. 10, 2025 for Japanese Patent Application No. 2023-571542, 4 pages.
Extended European Search Report, European Patent Application No. 22805126.4, mailed May 7, 2025, 8 pages.

* cited by examiner ns with gate-to-drain field plates can exhibit relatively poor reliability performance, particularly at class C (or higher class) operation where the electric field on the source side of the gate becomes significant.

FIELD EFFECT TRANSISTOR WITH SELECTIVE CHANNEL LAYER DOPING

STATEMENT OF GOVERNMENT RIGHTS

This invention was made with Government support under Department of Defense Contract No. N000164-19-C-WP50 awarded by the Department of the Navy. The Government has certain rights in the invention.

BACKGROUND

The present disclosure relates to transistor structures and in particular to GaN-based high electron mobility transistors.

Narrow bandgap semiconductor materials, such as silicon (Si) and gallium arsenide (GaAs), are widely used in semiconductor devices for low power and, in the case of Si, low frequency applications. However, these semiconductor materials may not be well-suited for high power and/or high frequency applications, for example, due to their relatively small bandgaps (1.12 eV for Si and 1.42 for GaAs at room temperature) and relatively small breakdown voltages.

Interest in high power, high temperature and/or high frequency applications and devices has focused on wide bandgap semiconductor materials such as silicon carbide (3.2 eV for 4H—SiC at room temperature) and the Group III nitrides (e.g., 3.36 eV for GaN at room temperature). These materials may have higher electric field breakdown strengths and higher electron saturation velocities than GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies, where the smaller bandgap material has a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

Field plates have been used to enhance the performance of GaN-based HEMTs at microwave frequencies and have exhibited performance improvement over devices without field plates. Many field plate approaches have involved a field plate connected to the source of the transistor with the field plate on top of the drain side of a channel. This can result in a reduction of the electric field on the gate-to-drain side of the transistor, thereby increasing breakdown voltage and reducing the high-field trapping effect. However, some transistors with gate-to-drain field plates can exhibit relatively poor reliability performance, particularly at class C (or higher class) operation where the electric field on the source side of the gate becomes significant.

FIG. 1 shows a GaN-based HEMT transistor device 10 formed on a silicon carbide substrate 12. A GaN channel layer 16 (also referred to as a GaN buffer layer 16) is on the substrate 12, and an AlGaN barrier layer 18 is on the channel layer 16. A two-dimensional electron gas (2DEG) 20 arises in the channel layer 16 adjacent the barrier layer 18. A source contact 22 and a drain contact 24 are formed on the channel layer 16. The conductivity of the 2DEG 20 is modulated by applying a voltage to a gate 26 that is formed on the barrier layer 18 between the source contact 22 and the drain contact 24. As shown in FIG. 1, the gate 26 may have a mushroom or T-top configuration in which the gate 26 contacts the barrier layer 18 in a relative narrow contact region that extends through a surface dielectric layer 25.

The transistor device 10 includes a field plate 40 that is connected to the source contact 22. The field plate 40 is spaced apart from the gate 26 by an interlayer dielectric layer 21, and is spaced apart from the barrier layer 18 by the interlayer dielectric layer 21 and the surface dielectric layer 25. The field plate 40 extends above the gate 26 and laterally toward the drain contact 24.

The field plate 40 is connected to the source contact 22. Connecting the field plate 40 to the source contact 22 provides a reduction in gate-to-drain capacitance (Cgd), which consequently can enhance the gain of the device. In addition to reducing gate-to-drain capacitance Cgd, the presence of the field plate 40 may improve linearity of the device and/or reduce the drain bias dependence of the capacitance. While GaN-based HEMTs generally display good linearity, further improvement may be desired for in high power RF applications. Moreover, while the structure shown in FIG. 1 can have a reduced gate-to-drain capacitance Cgd compared to structures without a field plate, the gate-to-drain capacitance Cgd can still show a large dependence on the bias of the drain contact 24.

SUMMARY

A transistor device according to some embodiments includes a channel layer, a barrier layer on the channel layer, and source and drain contacts on the barrier layer, and a gate contact on the barrier layer between the source and drain contacts. The channel layer includes a sub-layer having an increased doping concentration level relative to a remaining portion of the channel layer.

The sub-layer may be a buried sub-layer, and the device may further include a second sub-layer between the buried sub-layer and the barrier layer. The buried sub-layer has a thickness between 50 and 150 nm, and in some embodiments a thickness of about 100 nm. The second sub-layer may have a thickness between 50 and 150 nm, and in some embodiments a thickness of about 100 nm.

The buried sub-layer may be doped with an n-type dopant, such as silicon, having a doping concentration level greater than 2E16 cm$^{-3}$.

The doping concentration level of the n-type dopant may be between about 2E16 cm$^{-3}$ and 4E16 cm$^{-3}$, and in some cases about 3E16 cm$^{-3}$. The remaining portions of the channel layer may be doped with an n-type dopant having a doping concentration level less than 2E16 cm$^{-3}$, such as about 1E16 cm$^{-3}$.

The sub-layer may be a second sub-layer having a second doping concentration level, and the channel layer may include a first sub-layer having a first doping concentration level and a third sub-layer having a third doping concentration level. The second sub-layer is between the first sub-layer and the third sub-layer, and the second doping concentration level is higher than the first doping concentration level and the third doping concentration level. The second doping concentration level may be between about 2E16 cm$^{-3}$ and 4E16 cm$^{-3}$, and the first and third doping concentration levels may each be below about 2E16 cm$^{-3}$.

The channel layer may have a total thickness of about 500 nm or less.

The barrier layer and the channel layer may cooperate to induce a two-dimensional electron gas (2DEG) in the channel layer, and the transistor device may be a high electron mobility transistor. The channel layer may include GaN.

A method of forming a transistor device includes providing a channel layer, forming a barrier layer on the channel layer, and forming source and drain contacts on the barrier layer, and a gate contact on the barrier layer between the source and drain contacts. The channel layer may include a sub-layer having an increased doping concentration level relative to a remaining portion of the channel layer.

A transistor device according to further embodiments includes a channel layer, a barrier layer on the channel layer, and source and drain contacts on the barrier layer, and a gate contact on the barrier layer between the source and drain contacts. The channel layer includes a first sub-layer having a first doping concentration level, a second sub-layer having a second doping concentration level on the first sub-layer, and a third sub-layer having a third doping concentration level on the second sub-layer opposite the first sub-layer, wherein the third sub-layer is adjacent the barrier layer, and the second doping concentration level is higher than the first doping concentration level and the third doping concentration level.

The second doping concentration level may be between about 2E16 cm-3 and 4E16 cm$^{-3}$, and the first and third doping concentration levels are may each be less than about 2E16 cm$^{-3}$.

The first and third doping concentration levels may each be about 1E16 cm$^{-3}$, and the second doping concentration level may be about 3E16 cm$^{-3}$. The first and second sub-layers may each have a thickness between about 50 nm and 150 nm.

The transistor may further include a buried p-type region in the substrate beneath the source contact. In some embodiments, the transistor device may further include a field plate over the barrier layer between the gate contact and the drain contact, wherein the field plate is separated from the gate by an insulating layer. In some embodiments, the transistor device may further include a second field plate over the barrier layer between the gate contact and the drain contact.

DETAILED DESCRIPTION OF EMBODIMENTS

Embodiments of the inventive concepts will now be described in connection with the accompanying drawings.

Figure 1:
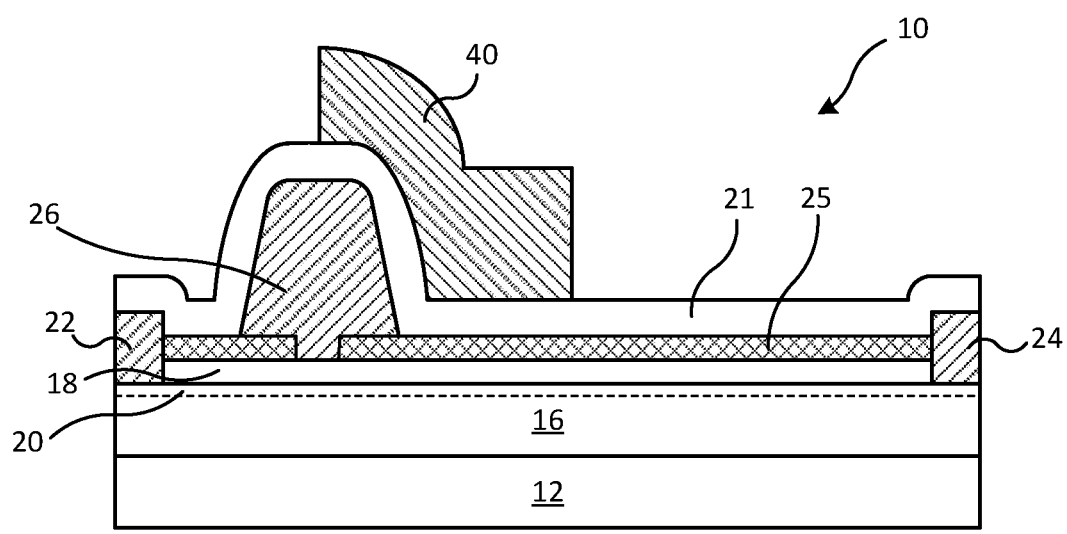
FIG. 1 is a cross-sectional view of a conventional transistor device including a field plate.
Figure 2A:
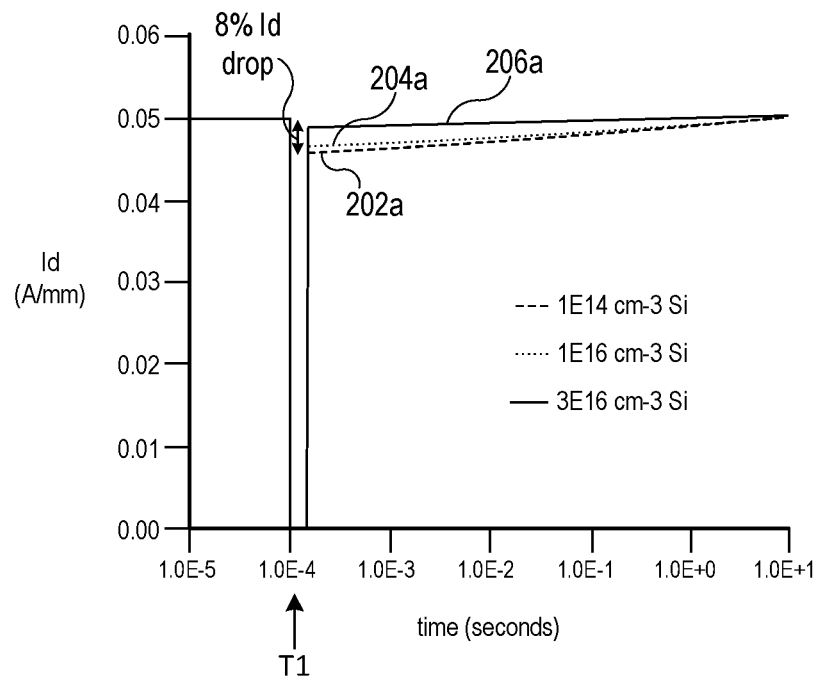
FIG. 2A is a graph of drain current versus time for conventional device structures.

In conventional GaN HEMT devices, such as the transistor device 10 shown in FIG. 1, the channel layer 16 may be doped with a dopant, such as carbon, to provide electron traps that help to achieve a desired breakdown voltage. The electron traps may cause memory effects that adversely affect device performance, such as, for example, causing gate lag. Reduction of gate lag as a result of doping the channel layer with an n-type dopant, such as silicon, is illustrated, for example, in FIG. 2A, which is a graph of simulated values of drain current (Id) as a function of time following a gate stress event for devices having uniformly doped channel layers with three different channel layer doping concentration levels, namely, 1E14 cm-3 (curve 202a), 1E16 cm-3 (curve 204a) and 3E16 cm-3 (curve 206a). As shown in FIG. 2A, after a −12V gate stress event at time T1, the drain current in the device with a more heavily doped channel layer (206) suffers a lower Id drop and recovers more quickly than in the devices with more lightly doped channel layers (202a, 204a).

Figure 2B:
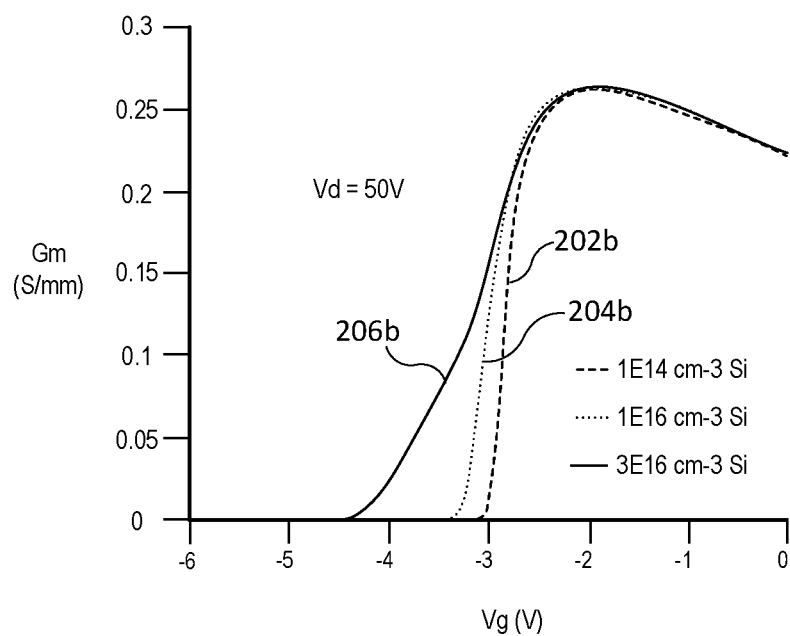
FIG. 2B is a graph of transconductance as a function of gate voltage for conventional device structures.

However, devices with more heavily doped channel layers may suffer from soft pinch-off or turn-on, which is a phenomenon in which the drain current of the device responds more slowly to changes in gate voltage, which is undesirable. This effect is illustrated in FIG. 2B, which is a graph of simulated values of transconductance (Gm) as a function of gate voltage (Vg) for devices having three different channel layer doping concentration levels, namely, 1E14 cm$^{-3}$ (curve 202b), 1E16 cm$^{-3}$ (curve 204b) and 3E16 cm$^{-3}$ (curve 206b). As shown in FIG. 2B, the transconductance curve of the device having a more heavily doped channel layer (curve 206b) has a lower slope relative to the devices having more lightly doped channel layers. Thus, when doping the channel layer with uniform doping, there is an undesirable tradeoff between gate lag and pinch-off/turn-on, in that doping the channel layer to improve gate lag may result in slower response of the drain current to gate voltage.

Some embodiments described herein avoid this and other problems by providing non-uniform doping of a channel layer. In particular, some embodiments described herein provide selectively doped buried layers in the channel layer with increased doping concentration levels. These layers may compensate the electron trapping effect so that gate lag may be reduced under high gate bias. With the proper doping profile, it has been found that the gate lag problem can be overcome without introducing other negative effects, such as soft pinch-off.

Figure 3:
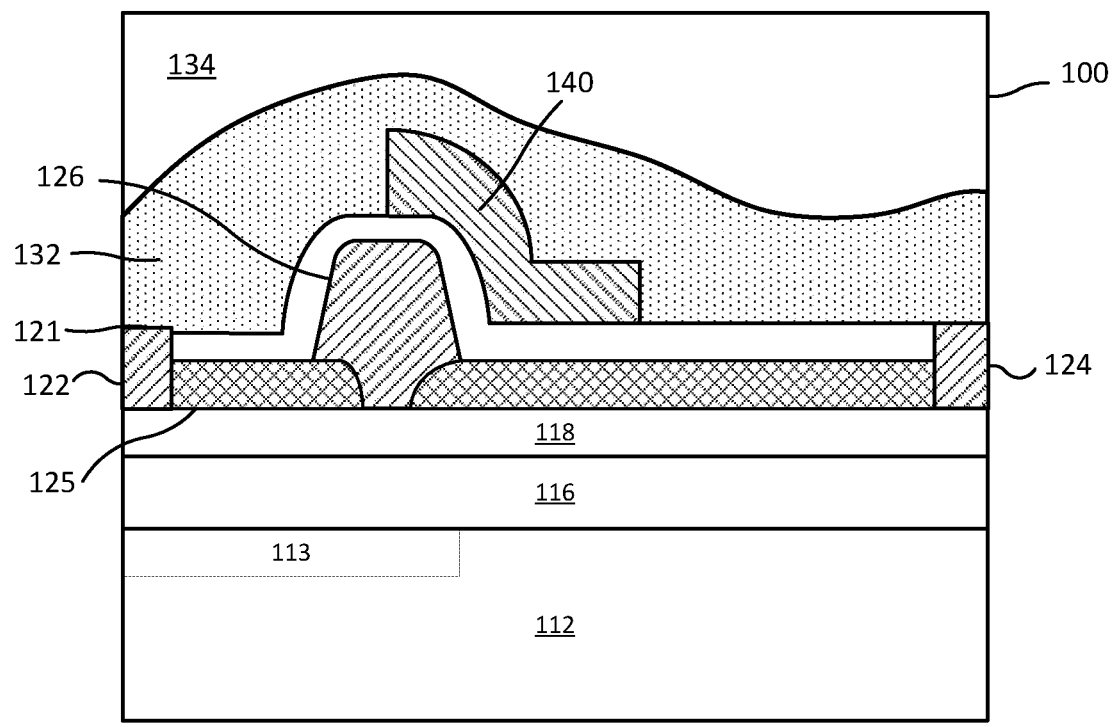
FIG. 3 is a cross-sectional view of a transistor device including a field plate in accordance with some embodiments.

Referring to FIG. 3, a transistor device according to some embodiments is illustrated. In particular, FIG. 3 illustrates a high electron mobility transistor (HEMT) device 100 formed on a substrate 112. A channel layer 116 is formed on the substrate 112, and a barrier layer 118 is on the channel layer 116.

A source contact 122 and a drain contact 124 are formed on the barrier layer 118. A gate 126 is formed on the barrier layer 118 between the source contact 122 and drain contact 124. As shown in FIG. 3, the gate 126 may have a mushroom or T-top configuration in which the gate 126 contacts the barrier layer 118 in a relatively narrow contact region of a recessed contact portion 127 of the gate 126 that extends through a surface dielectric layer 125 within a gate aperture 162 that extends through the surface dielectric layer 125.

The source and drain contacts 122, 124, may include a metal, such as TiAlN, that can form an ohmic contact to Group III nitride-based materials. The gate 126 may include a metal capable of making a Schottky contact to a nitride based semiconductor material, such as Ni, Pt, NiSix, Cu, Pd, Cr, TaN, W, and/or WSiN.

A buried p-type region 113 is formed in the substrate 112 beneath the channel layer and may be connected to the source contact 122 of the device. The buried p-type region 113 may extend vertically to a depth of about 0.75 microns into the substrate, and may extend laterally past the gate contact 126 and toward the drain contact 124 by a distance of about 0.4 microns.

The buried p-type region 113 may be floating or may be connected to the source contact 122 or to the gate 126, or may be independently biased. The buried p-type region 113 may be omitted in some embodiments. The buried p-type region 113 may be formed as described in U.S. Pat. No. 10,892,356, entitled "Group III-nitride high-electron mobility transistors with buried p-type layers and process for making the same," the disclosure of which is incorporated herein by reference in its entirety.

In some embodiments, the buried p-type region 113 may be formed via epitaxial growth, selective etching and epitaxial regrowth on the substrate and/or via ion implantation. The buried p-type region 113 may extend laterally beneath the source contact 122 and the gate contact 126. In some embodiments, the buried p-type region 113 may be spaced laterally from the source contact 122 and/or the gate contact 126 so that it does not extend laterally beneath the source contact 122 and/or the gate contact 126.

In some embodiments, the substrate 112 includes silicon carbide, the channel layer 116 includes GaN, and the barrier layer includes AlGaN. However, it will be appreciated that other materials or combinations of materials can be used. Moreover, the channel layer 116 and/or the barrier layer 118 may include an alloy such as $Al_xGa_{1-x}N$, where $0 \leq x \leq 1$. It will be further appreciated that although a HEMT device is illustrated, the HEMT device 100 may be another type of transistor device, such as a metal-semiconductor field effect transistor (MESFET), a junction field effect transistor (JFET), a metal oxide semiconductor field effect transistor (MOSFET), etc.

The HEMT device 100 may include a field plate 140 that is connected to the source contact 122 via a connection outside the active region of the device. The field plate 140 is spaced apart laterally from the gate 126 by an interlayer dielectric layer 121. The field plate 140 may be electrically connected to the source contact 122 outside the active region of the device (and outside the plane illustrated in FIG. 3). In some embodiments, the field plate 140 may be connected to the gate 126 instead of the source contact 122, or may be independently biased.

The field plate 140 is generally vertically spaced apart from the barrier layer 118 by the interlayer dielectric layer 121 and the surface dielectric layer 125.

It will be appreciated that in some embodiments, the field plate 140 may be omitted.

A passivation layer 132 is formed over the interlayer dielectric layer 121 and the field plate 140, and a field dielectric layer 134 is formed over the passivation layer 132. The passivation layer 132 may fill a gap between the field plate 140 and the gate 126 that is not filled by the interlayer dielectric layer 121.

The surface dielectric layer 125, the interlayer dielectric layer 121, the passivation layer 132 and the field dielectric layer 134 may include one or more layers of silicon nitride, silicon oxide, silicon oxynitride, aluminum oxide or other atomic layer deposition films, or a multilayer insulator structure, such as an oxide-nitride-oxide layer. In particular embodiments, the surface dielectric layer 125 and the interlayer dielectric layer 121 comprise silicon nitride, the passivation layer 132 comprises silicon oxynitride, and the field dielectric layer 134 comprises silicon nitride.

Figure 11A:
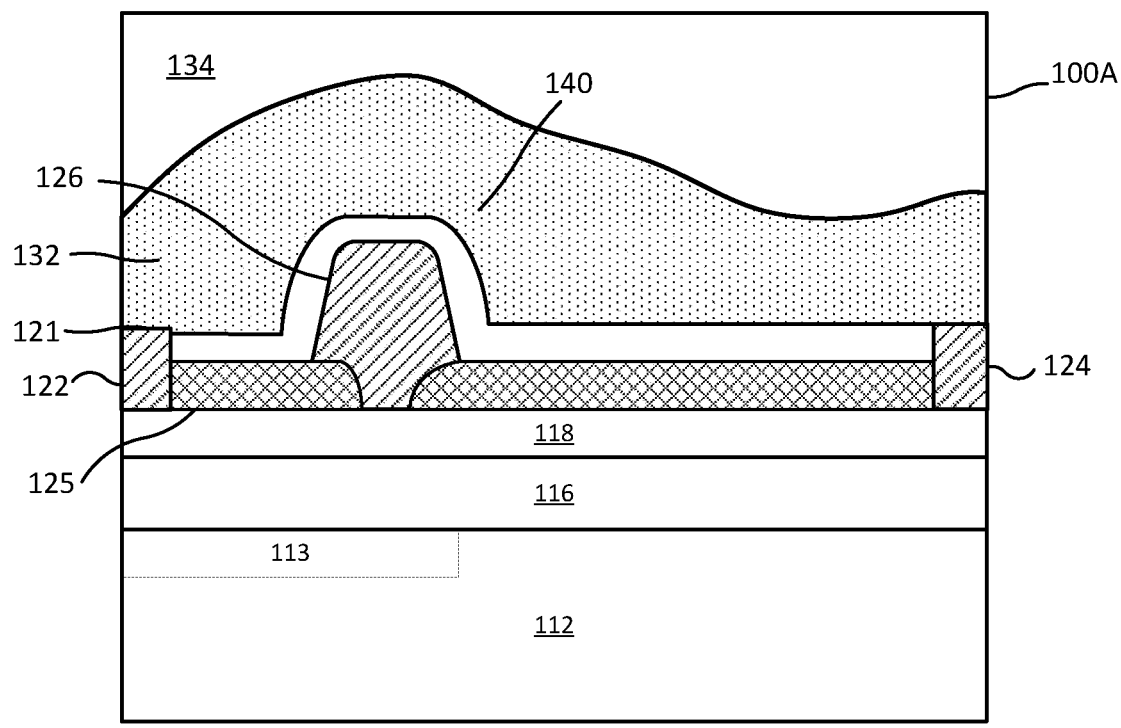
FIGS. 11A to 11C are cross-sectional views of transistor devices in accordance with various further embodiments.
Figure 11B:
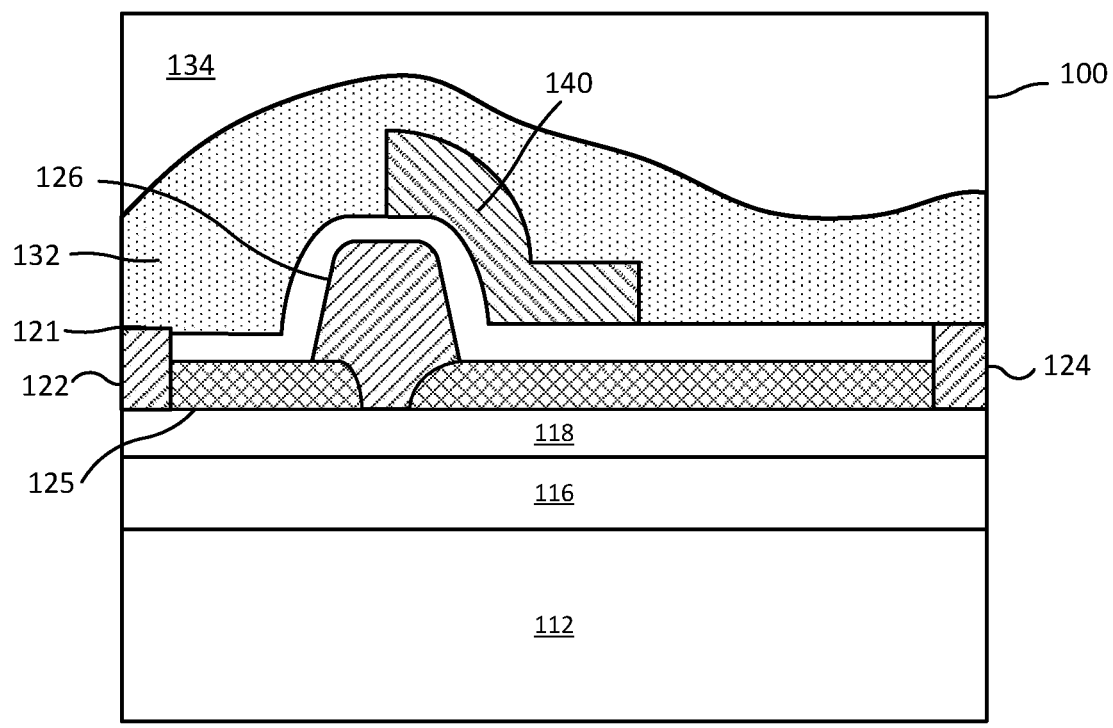
Figure 11C:
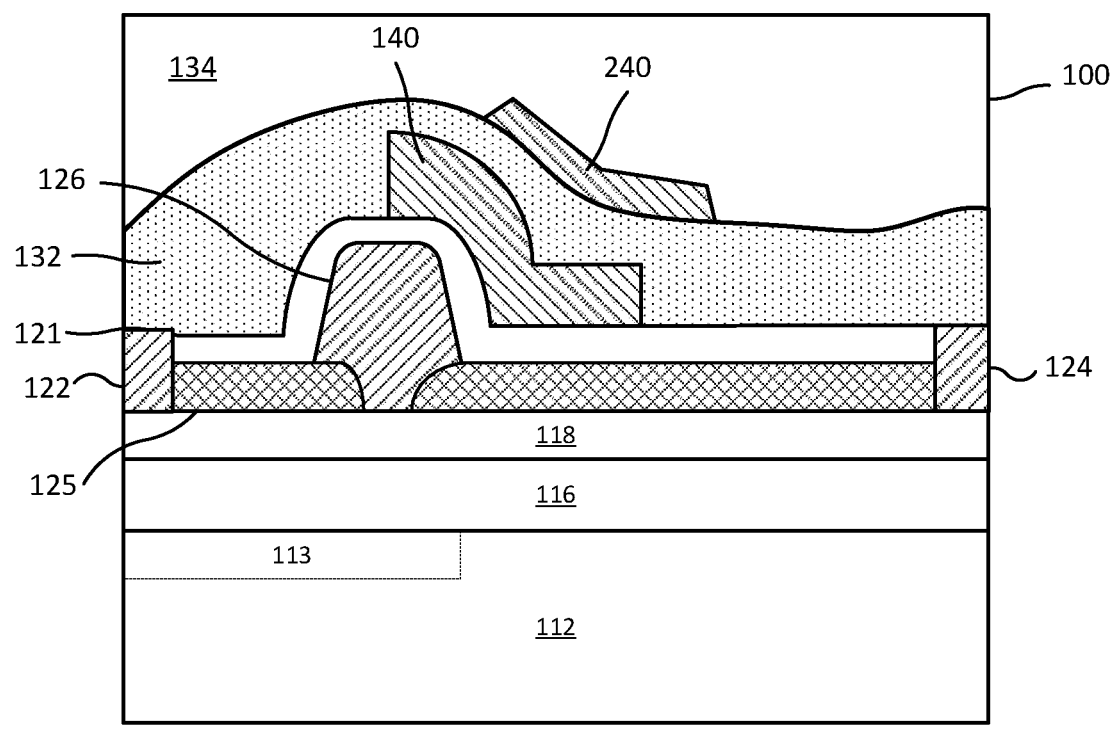

FIGS. 11A to 11C illustrate GaN HEMT devices according to various further embodiments. For example, FIG. 11A illustrates a HEMT device 100A that is similar to the HEMT device 100 shown in FIG. 3 (with like reference signs referring to like elements), except that in the device 100A, the field plate 140 is omitted as discussed above.

FIG. 11B illustrates a HEMT device 100B that is similar to the HEMT device 100 shown in FIG. 3 (with like reference signs referring to like elements), except that in the HEMT device 1008, the buried p-type region 113 is omitted as discussed above.

FIG. 11C illustrates a HEMT device 100C that is similar to the HEMT device 100 shown in FIG. 3 (with like reference signs referring to like elements), except that in the HEMT device 100C, a second field plate 240 is provided. The second field plate is insulated from the first field plate by the passivation layer 132. Alternatively, a separate insulating interlayer may be provided between the first field plate 140 and the second field plate 240. The first and/or second field plates 140, 240 may each be connected to the source contact 122 or the gate 126, or may be independently biased.

It will be appreciated that the modifications shown in FIGS. 11A to 11C are not mutually exclusive, and various of the modifications illustrated therein (and others) may be made alone or together to the device shown in FIG. 3.

Figure 4:
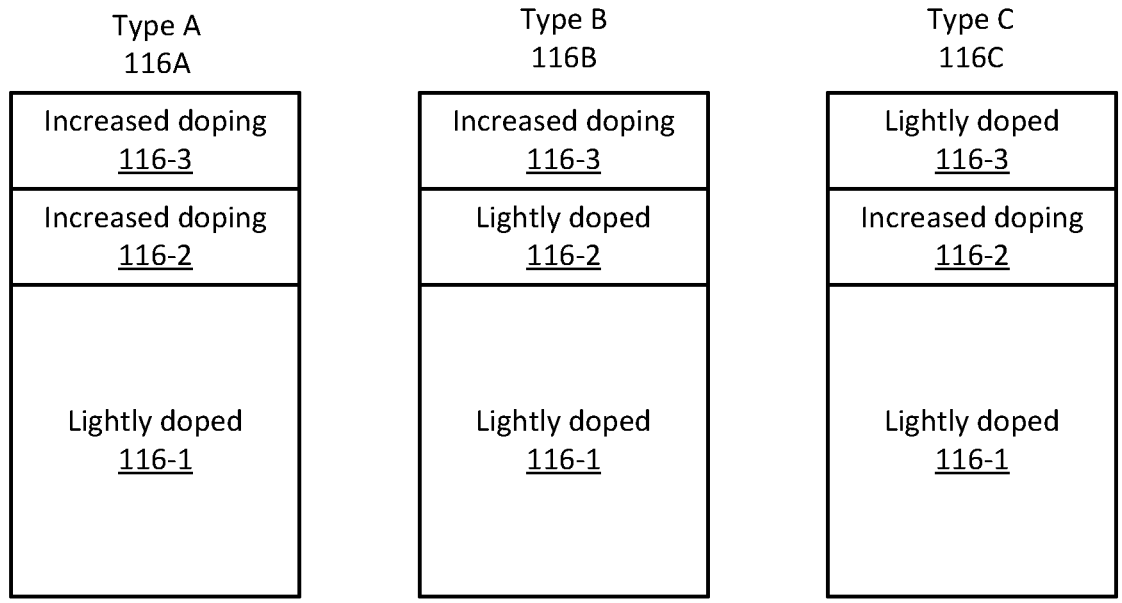
FIG. 4 illustrates channel layer doping arrangements of a transistor device structure according to various embodiments.

FIG. 4 illustrates channel layer structures 116A, 116B and 116C of a GaN-based HEMT, such as the HEMT device 100 shown in FIG. 3. The channel layer structures 116A, 116B and 116C have three different types of non-uniform doping profiles according to various embodiments, illustrated as Type A, Type B and Type C. Each channel layer structure 116A-116C includes three sub-layers 116-1, 116-2, 116-3, where the uppermost sub-layer 116-3 is nearest the barrier layer 118 and farthest from the substrate 112 in the structure shown in FIG. 3. In the examples shown in FIG. 4, the first sub-layer 116-1 is lightly doped and is thicker than the second and third sub-layers 116-2, 116-3. For example, the first sub-layer 116-1 in each example may have a thickness of between 200 and 500 nm, and in particular may have a thickness of about 300 nm. The first sub-layer 116-1 may be doped with silicon dopants at a doping concentration level of less than $3E16$ cm$^{-3}$, and in particular about $1E16$ cm$^{-3}$.

The second and third sub-layers 116-2, 116-3 in each channel layer structure may have a smaller thickness than the first sub-layers 116-1. For example, the second and third sub-layers 116-2, 116-3 may have thicknesses less than 300 nm, such as 50 nm to 150 nm. In particular embodiments, the second and third sub-layers 116-2, 116-3 may have thicknesses of about 100 nm.

In the Type A channel layer structure 116A, both the second and third sub-layers 116-2, 116-3 have increased doping concentration levels relative to the first sub-layer 116-1. For example, both the second and third sub-layers 116-2, 116-3 may be doped with silicon at a doping concentration level greater than $1E16$ cm'. For example, both the second and third sub-layers 116-2, 116-3 may be doped with silicon at a doping concentration level of between about $2E16$ cm$^{-3}$ and $4E16$ cm$^{-3}$. In particular embodiments, both the second and third sub-layers 116-2, 116-3 may be doped with silicon at a doping concentration level of about $3E16$ cm$^{-3}$.

In the Type B channel layer structure 116B, the third sub-layer 116-3 has an increased doping concentration level relative to the first sub-layer 116-1 and the second sub-layer 116-2. For example, the third sub-layer 116-3 may be doped with silicon at a doping concentration level greater than $1E16$ cm$^{-3}$. For example, the third sub-layer 116-3 may be doped with silicon at a doping concentration level of between about $2E16$ cm$^{-3}$ and $4E16$ cm$^{-3}$. In particular embodiments, the third sub-layer 116-3 may be doped with silicon at a doping concentration level of about $3E16$ cm$^{-3}$. The second sub-layer 116-2 may have a doping concentration level less than the doping concentration level of the third sub-layer 116-3. In particular embodiments, the second layer may have the same doping concentration layer as the first sub-layer 116-1, e.g., $1E16$ cm$^{-3}$.

In the Type C channel layer structure 116C, the second sub-layer 116-2 has an increased doping concentration level relative to the first sub-layer 116-1 and the third sub-layer 116-3. For example, the second sub-layer 116-2 may be doped with silicon at a doping concentration level greater than $1E16$ cm$^{-3}$. For example, the second sub-layer 116-2 may be doped with silicon at a doping concentration level of between about $2E16$ cm$^{-3}$ and $4E16$ cm$^{-3}$. In particular embodiments, the second sub-layer 116-2 may be doped with silicon at a doping concentration level of about $3E16$ cm$^{-3}$. The third sub-layer 116-3 may have a doping concentration level less than the doping concentration level of the second sub-layer 116-2. In particular embodiments, the third layer may have the same doping concentration layer as the first sub-layer 116-1, e.g., $1E16$ cm$^{-3}$. Accordingly, in the Type C channel layer structure, the second sub-layer 116-2 forms a buried sub-layer in the channel layer 116 having an increased doping concentration level.

The doping concentration level in the channel layer is preferably kept at a relatively low level, such as below $4E16$ cm$^{-3}$, because increased doping in the channel layer can make it difficult to pinch off the channel, resulting in undesirable current leakage.

Figure 5A:
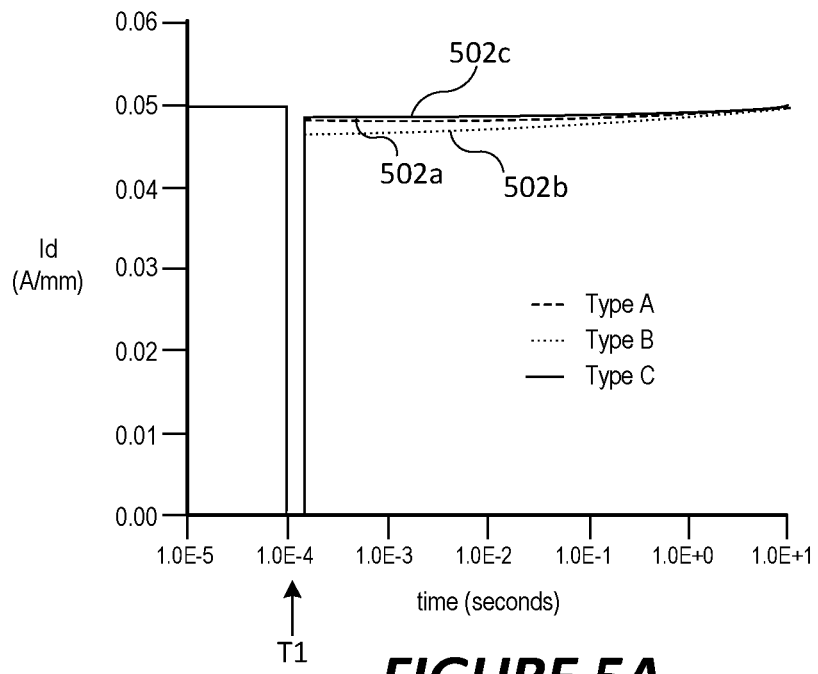
FIG. 5A is a graph of drain current versus time for a device structure according to some embodiments.
Figure 5B:
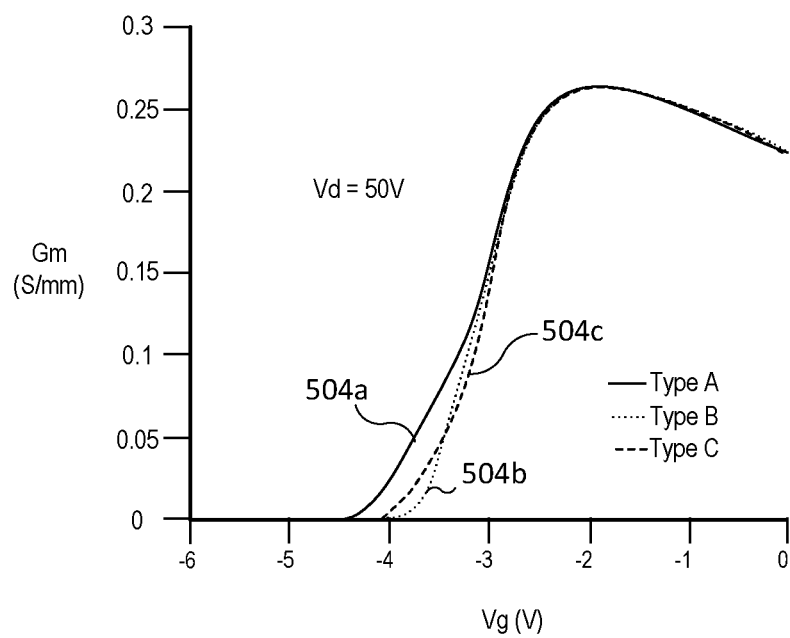
FIG. 5B is a graph of transconductance as a function of gate voltage for a device structure according to some embodiments.

FIG. 5A is a graph of simulated values of drain current (Id) as a function of time following a gate stress event for devices having the three different channel layer structures illustrated in FIG. 4, and FIG. 5B is a graph of simulated values of transconductance (Gm) as a function of gate voltage (Vg) for devices having the three different channel layer structures illustrated in FIG. 4.

As shown in FIG. 5A, after a −12V gate stress event at time T1, the drain current in the devices with Type A (502a) and Type C (502c) channel layer structures suffer less Id drop and recover more quickly than the device with Type B (502b) channel layer structure.

As shown in FIG. 5B, the transconductance curve of the devices with Type B (504b) and Type C (504c) channel layer structures have better transconductance properties (i.e., greater slope) than the device with the Type A (504a) channel layer structure. These results illustrate improved device performance for both gate lag and drain lag for the devices with Type C channel layer structure, i.e., devices having buried sub-layers with increased doping concentration levels relative to the upper and lower channel sub-layers.

FIGS. 6A to 6H are cross-sectional views illustrating operations for manufacturing a transistor device including a field plate in accordance with some embodiments.

Figure 6A:
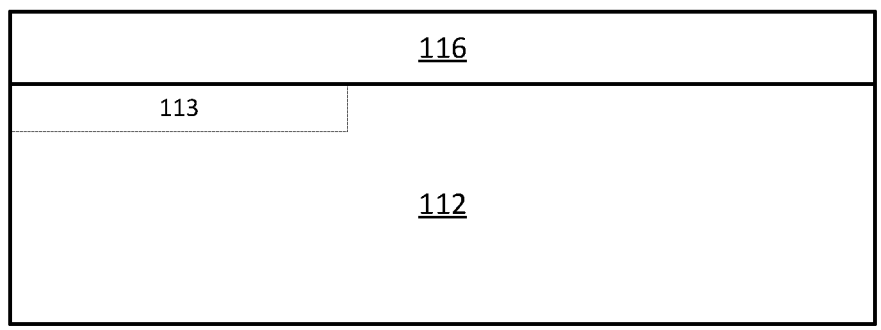
FIGS. 6A to 6H are cross-sectional views illustrating operations for manufacturing a transistor device including a field plate in accordance with some embodiments.

Referring to FIG. 6A, a silicon carbide substrate 112 is provided on which a channel layer 116 is formed. The channel layer 116 may be doped with carbon and/or iron dopants as is known in the art. An n-type dopant, such as silicon, is incorporated into the channel layer 116 during epitaxial growth to provide a non-uniform doping concentration within the channel layer 116 as described herein in connection with FIG. 4.

A buried p-type region 113 may be formed in the substrate 112 beneath the channel layer and may be connected to the source contact 122 of the device. In various embodiments, the buried p-type region 113 may be floating or may be connected to the gate 126, or may be independently biased.

The buried p-type region 113 may be formed by implantation of p-type dopants, such as aluminum ions, into the substrate 112 prior to growth of the nitride-based epitaxial layers 116, 118 thereon.

In some embodiments, the buried p-type region 113 may be formed via epitaxial growth, selective etching and epitaxial regrowth on the substrate and/or via ion implantation. The buried p-type region 113 may extend laterally beneath the source contact 122 and the gate contact 126. In some embodiments, the buried p-type region 113 may be spaced laterally from the source contact 122 and/or the gate contact 126 so that it does not extend laterally beneath the source contact 122 and/or the gate contact 126.

Figure 6B:
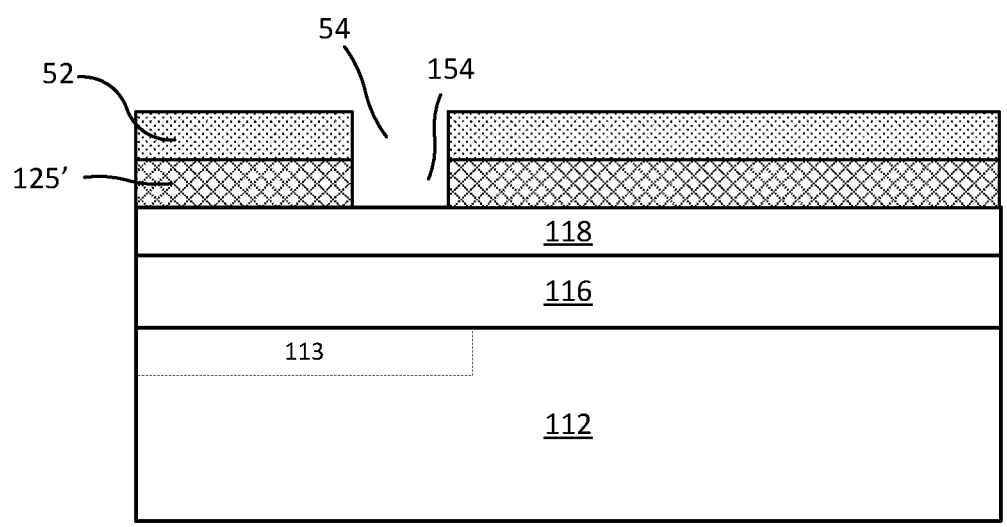

Referring to FIG. 6B, a barrier layer 118 is formed on the channel layer 116, and a preliminary surface dielectric layer 125' is formed on the barrier layer 118. A layer of photoresist 52 is formed on the preliminary surface dielectric layer 125' and patterned to form an opening 54 therein.

The preliminary surface dielectric layer 125' is selectively etched through the opening 54, for example using a reactive ion etch or inductively coupled plasma, to form a corresponding opening 154 therein.

Figure 6C:
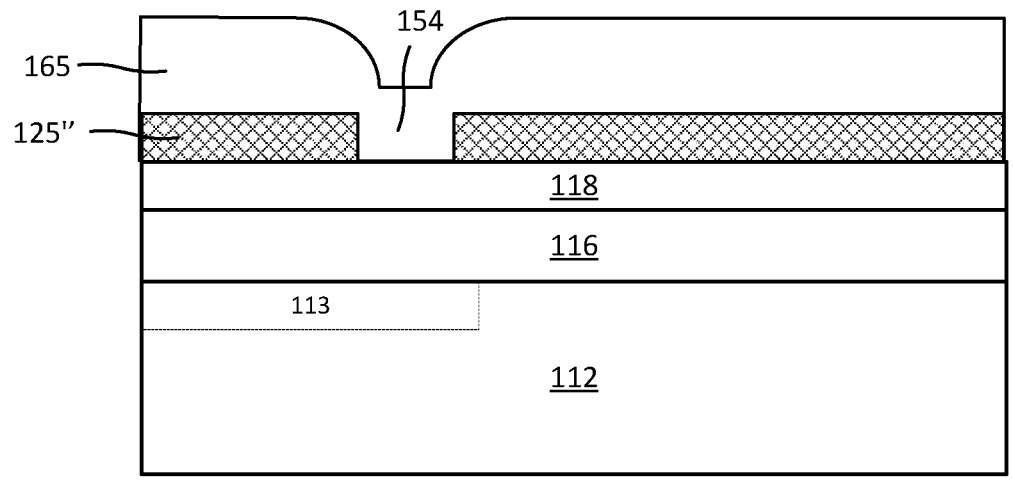

Referring to FIG. 6C, a sacrificial dielectric layer 165 is blanket deposited over the preliminary surface dielectric layer 125' to fill the opening 154. The sacrificial dielectric layer 165 may be formed of the same material as the preliminary surface dielectric layer 125'. For example, both the sacrificial dielectric layer 165 and the preliminary surface dielectric layer 125' may be formed of silicon nitride.

Figure 6D:
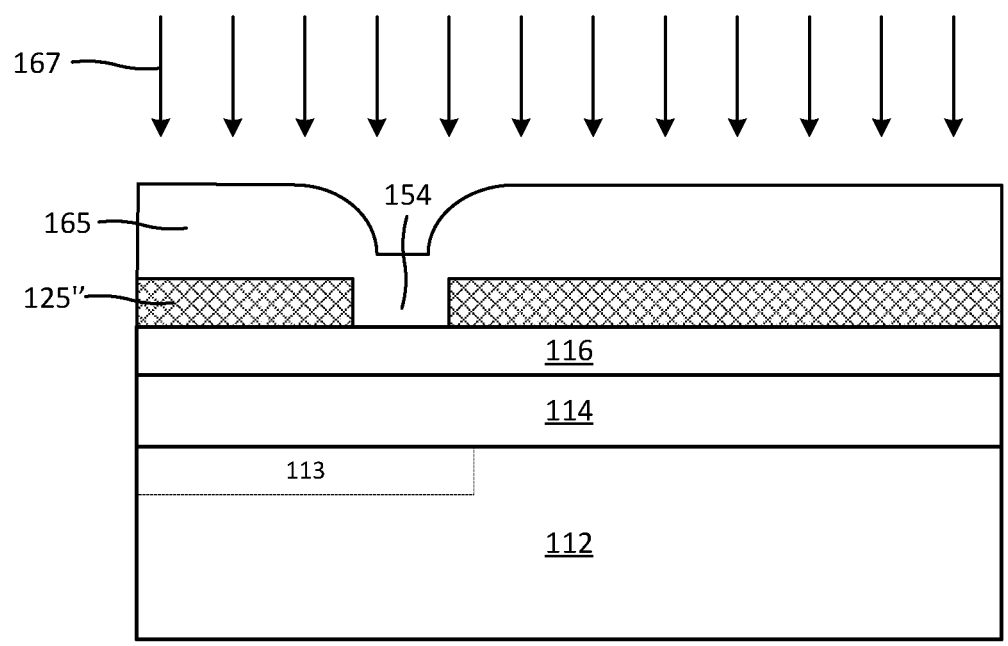
Figure 6E:
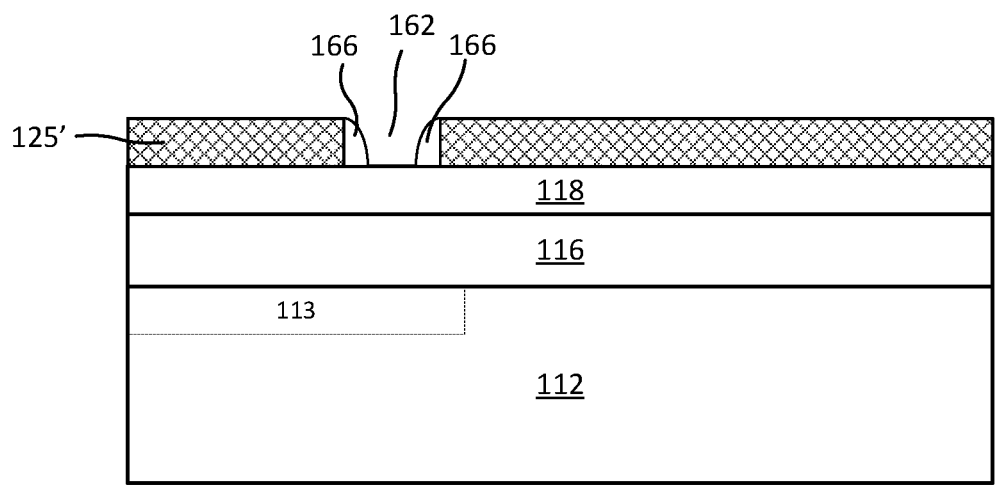

Referring to FIG. 6D, the sacrificial dielectric layer 165 is anisotropically etched, for example using a reactive ion etch or inductively coupled plasma 167, to remove portions of the sacrificial dielectric layer 165 except for side portions 166 on the inner surfaces of the opening 154 of the preliminary surface dielectric layer 125' to form a gate aperture 162 having rounded or beveled edges, as shown in FIG. 6E. The preliminary surface dielectric layer 125' along with the side portions 166 together form a surface dielectric layer 125 on the barrier layer 118. With the side portions 166 present, the width of the gate aperture 162 may be about 250 nm.

Figure 6F:
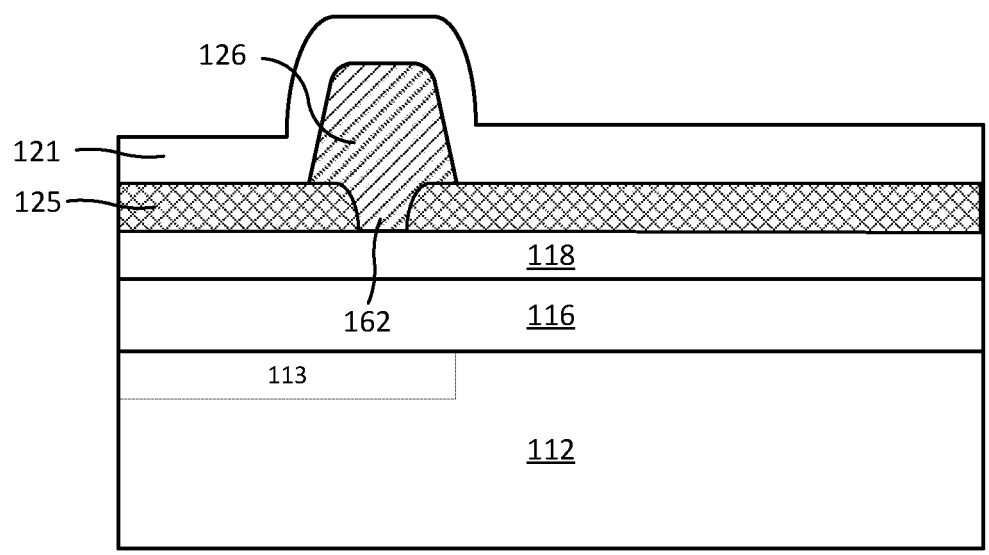

Referring to FIG. 6F, a metal, such as gold, is deposited and patterned to form a mushroom or T-top gate 126 on the surface dielectric layer 125. An interlayer dielectric layer 121 is then blanket deposited over the surface dielectric layer 125 and the gate 126.

Figure 6G:
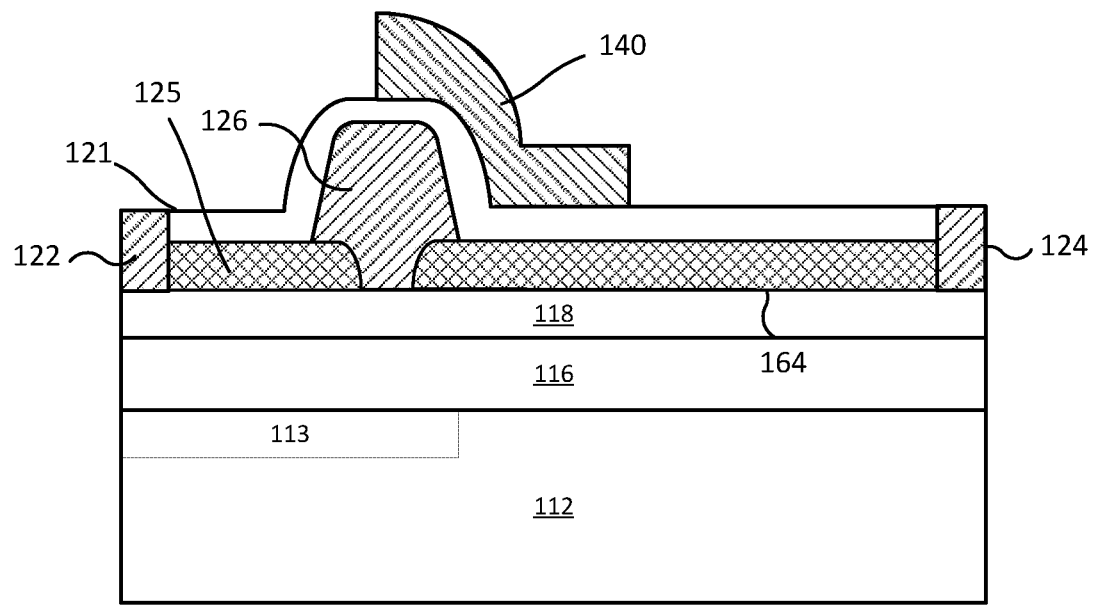

Referring to FIG. 6G, a metal, such as gold, is then deposited on the interlayer dielectric layer 121 and patterned to form a field plate 140. Source 122 and drain 124 contacts are formed on the barrier layer 118. Heavily doped source and drain contact regions (not shown) may be formed within the barrier layer 118 prior to forming the source 122 and drain 124 contacts thereto to provide ohmic contact to the 2DEG channel.

Figure 6H:
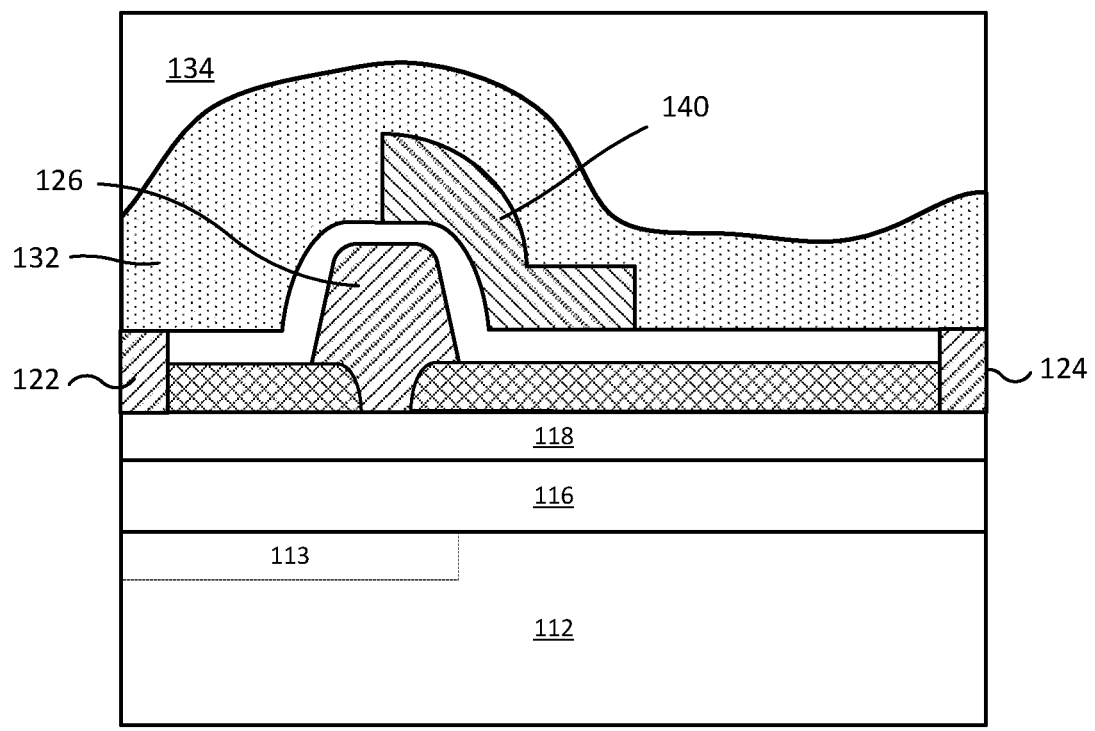

Referring to FIG. 6H, a passivation layer 132, such as a layer of SiON, is formed over the field plate 140 and the interlayer dielectric layer 121. Finally, a field dielectric layer 134, such as silicon nitride, is formed over the passivation layer 132.

Figure 7:
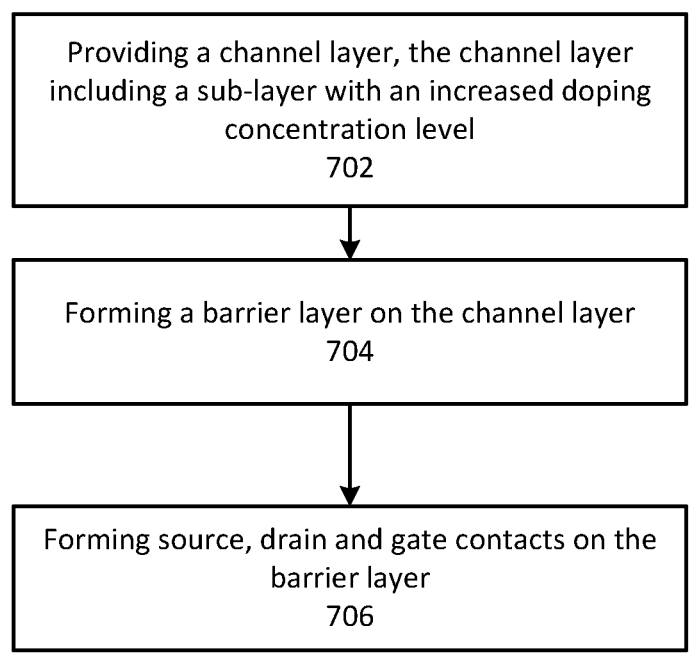
FIG. 7 is a block diagram illustrating operations of forming a transistor device according to some embodiments.

FIG. 7 is a block diagram illustrating operations of forming a transistor device according to some embodiments. Referring to FIG. 7 and FIGS. 6A to 6H, a method of forming a transistor device according to some embodiments includes providing a channel layer including a sub-layer having an increased doping concentration level relative to a remaining portion of the channel layer (block 802), forming a barrier layer on the channel layer (block 804), and forming source and drain contacts on the barrier layer, and a gate contact on the barrier layer between the source and drain contacts (block 806).

The sub-layer may be a buried sub-layer, the device may further include a second sub-layer between the buried sub-layer and the barrier layer. The buried sub-layer may have a thickness of about 50 nm to 150 nm and a doping concentration level greater than $2E16\ cm^{-3}$. The buried sub-layer may be doped with an n-type dopant, such as silicon. In some embodiments, the doping concentration level of the n-type dopant may be between about $2E16\ cm^{-3}$ and $4E16\ cm^{-3}$.

Transistor devices as described herein may be used in amplifiers that operate in a wide variety of different frequency bands. In some embodiments, the RF transistor amplifiers incorporating transistor devices as described herein may be configured to operate at frequencies greater than 1 GHz. In other embodiments, the RF transistor amplifiers may be configured to operate at frequencies greater than 2.5 GHz. In still other embodiments, the RF transistor amplifiers may be configured to operate at frequencies greater than 3.1 GHz. In yet additional embodiments, the RF transistor amplifiers may be configured to operate at frequencies greater than 5 GHz. In some embodiments, the RF transistor amplifiers may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the inventive concepts have been discussed above with respect to HEMT devices, it will be understood that the inventive concepts described herein may be applied to other types of semiconductor devices, such as MOSFETs, DMOS transistors, and/or laterally diffused MOS (LDMOS) transistors.

RF transistor amplifiers incorporating transistor devices described herein can be used in standalone RF transistor amplifiers and/or in multiple RF transistor amplifiers. Examples of how the RF transistor amplifiers according to some embodiments may be used in applications that include multiple amplifiers will be discussed with reference to FIGS. 8A-8C.

Figure 8A:
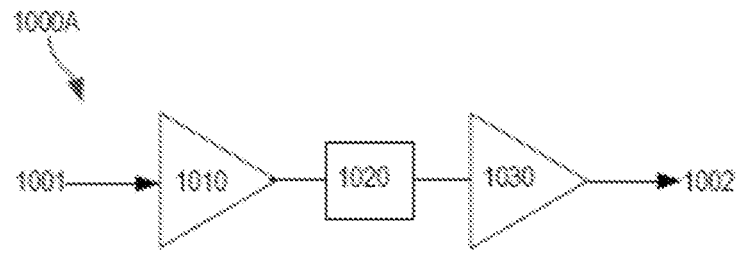
FIGS. 8A-8C are schematic block diagrams of multi-amplifier circuits in which RF transistor amplifiers incorporating transistor devices according to embodiments may be used.

Referring to FIG. 8A, an RF transistor amplifier 1000A is schematically illustrated that includes a pre-amplifier 1010 and a main amplifier 1030 that are electrically connected in series. As shown in FIG. 8A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 8A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 8B:
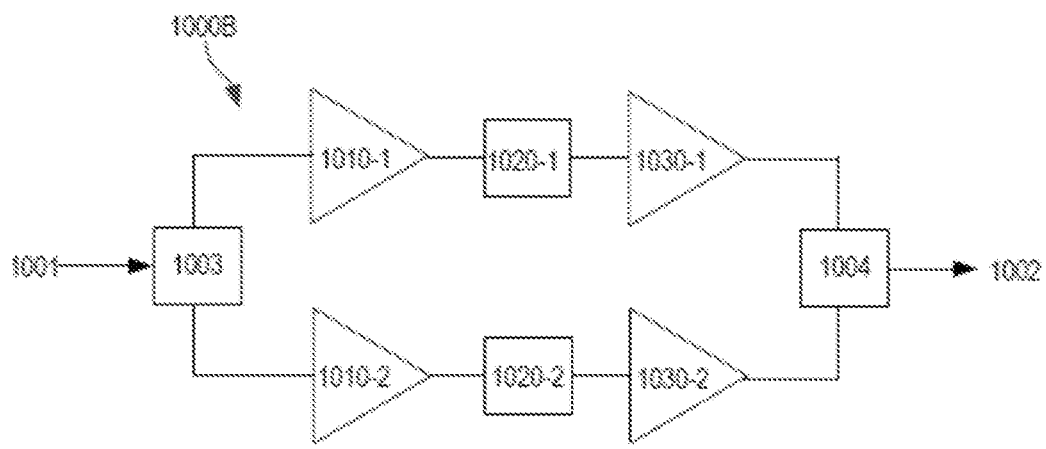

Referring to FIG. 8B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 9A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 8C:
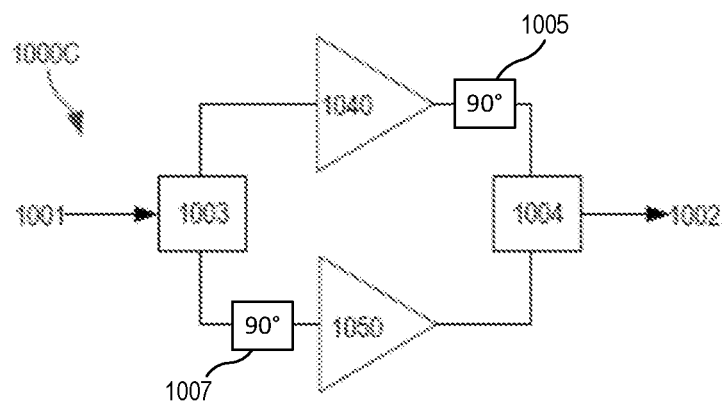

As shown in FIG. 8C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 8C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Figure 9:
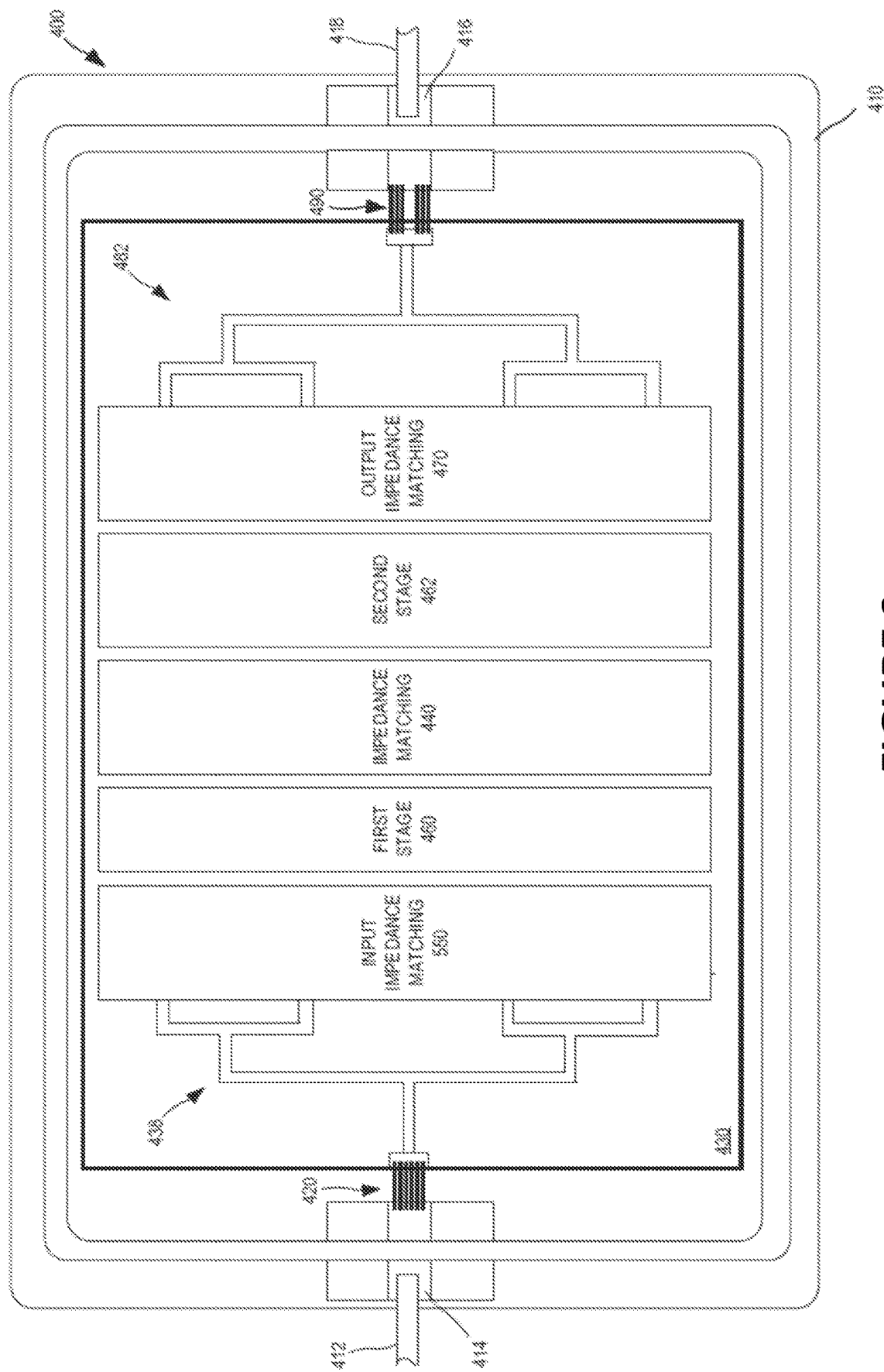
FIG. 9 is a schematic plan view of a monolithic microwave integrated circuit RF transistor amplifier according to some embodiments.

FIG. 9 is a plan view of a MMIC RF transistor amplifier 400 according to embodiments of the present inventive concepts. As shown in FIG. 9, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic material.

The package 410 includes an input lead 412 and an output lead 418. The input lead 412 may be mounted to an input lead pad 414 by, for example, soldering. One or more input bond wires 420 may electrically connect the input lead pad 414 to an input bond pad on the integrated circuit chip 430. The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482.

The package 410 further includes an output lead 418 that is connected to an output lead pad 416 by, for example, soldering. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present inventive concepts.

The RF transistor amplifiers according to embodiments of the present inventive concepts may be designed to operate in a wide variety of different frequency bands. In some embodiments, these RF transistor amplifier dies may be configured to operate in at least one of the 0.6-2.7 GHz, 3.4-4.2 GHz, 5.1-5.8 GHz, 12-18 GHz, 18-27 GHz, 27-40 GHz or 40-75 GHz frequency bands or sub-portions thereof. The techniques according to embodiments of the present inventive concepts may be particularly advantageous for RF transistor amplifiers that operate at frequencies of 10 GHz and higher.

Figure 10A:
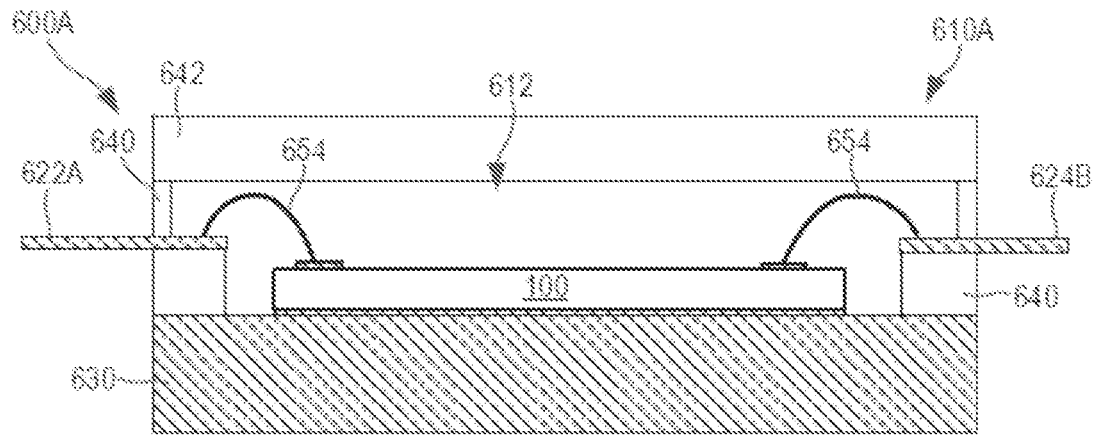
FIGS. 10A and 10B are schematic cross-sectional views illustrating two example ways that an RF transistor device according to some embodiments may be packaged to provide RF transistor amplifiers.
Figure 10B:
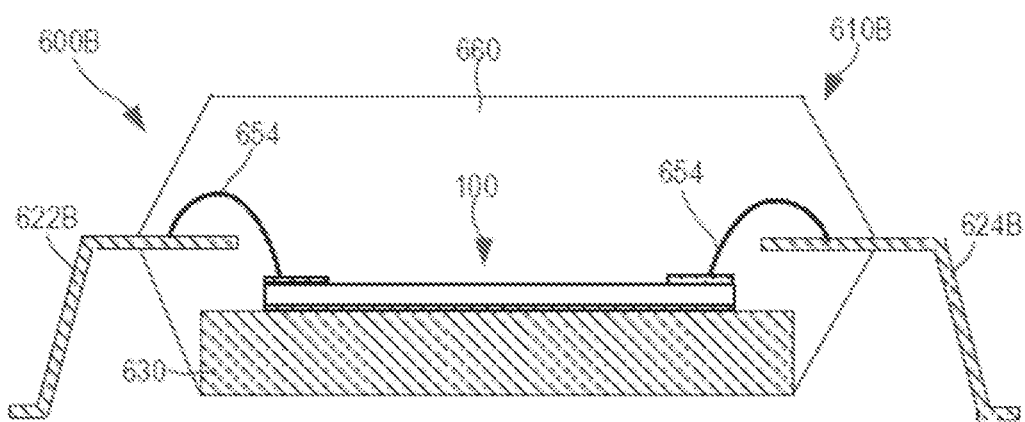

FIGS. 10A and 10B are schematic cross-sectional views illustrating several example ways that that the RF transistor amplifier dies according to embodiments of the present inventive concepts may be packaged to provide packaged RF transistor amplifiers 600A and 600B, respectively.

FIG. 10A is a schematic side view of a packaged Group III nitride-based RF transistor amplifier 600A. As shown in FIG. 10A, packaged RF transistor amplifier 600A includes the RF transistor amplifier die 100 packaged in an open cavity package 610A. The package 610A includes metal gate leads 622A, metal drain leads 624A, a metal submount 630, sidewalls 640 and a lid 642.

The submount 630 may include materials configured to assist with the thermal management of the package 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials.

In some embodiments, the sidewalls 640 and/or lid 642 may be formed of, for example, Al2O3. The lid 642 may be glued to the sidewalls 640 using an epoxy glue. The sidewalls 640 may be attached to the submount 630 via, for example, braising. The gate lead 622A and the drain lead 624A may be configured to extend through the sidewalls 640, though embodiments of the present inventive concepts are not limited thereto.

The RF transistor amplifier die 100 is mounted on the upper surface of the metal submount 630 in an air-filled cavity 612 defined by the metal submount 630, the ceramic sidewalls 640 and the ceramic lid 642. The gate and drain terminals of RF transistor amplifier die 100 may be on the top side of the structure, while the source terminal is on the bottom side of the structure.

The gate lead 622A may be connected to the gate terminal of RF transistor amplifier die 100 by one or more bond wires 654. Similarly, the drain lead 624A may be connected to the drain terminal of RF transistor amplifier die 100 by one or more bond wires 654. The source terminal may be mounted on the metal submount 630 using, for example, a conductive die attach material (not shown). The metal submount 630 may provide the electrical connection to the source terminal and may also serve as a heat dissipation structure that dissipates heat that is generated in the RF transistor amplifier die 100.

The heat is primarily generated in the upper portion of the RF transistor amplifier die 100 where relatively high current densities are generated in, for example, the channel regions of the unit cell transistors 102. This heat may be transferred though the source vias 146 and the semiconductor layer structure 150 to the source terminal and then to the metal submount 630.

FIG. 10B is a schematic side view of another packaged Group III nitride based RF transistor amplifier 600B. RF transistor amplifier 600B differs from RF transistor amplifier 600A in that it includes a different package 610B. The package 610B includes a metal submount 630, as well as metal gate and drain leads 622B, 624B. RF transistor amplifier 600B also includes a plastic overmold 660 that at least partially surrounds the RF transistor amplifier die 100, the leads 622B, 624B, and the metal submount 630.

Other components of RF transistor amplifier 600B may be the same as the like-numbered components of RF transistor amplifier 600A and hence further description thereof will be omitted. While embodiments of the present inventive concepts are described above with respect to gallium nitride based RF transistor amplifiers, it will be appreciated that embodiments of the inventive concepts are not limited thereto. For example, the transistors described above may also be used as power transistors in switching and other applications.

Embodiments of the present inventive concepts have been described above with reference to the accompanying drawings, in which embodiments of the inventive concepts are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout. In the specification and the figures, two-part reference numbers (i.e., two numbers separated by a dash, such as 100-1) may be used to identify like elements. When such two-part reference numbers are employed, the full reference numeral may be used to refer to a specific instance of the element, while the first part of the reference numeral may be used to refer to the elements collectively.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items. The terminology used herein is for the purpose of describing particular embodiments only and is not intended to be limiting of the inventive concepts. As used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Relative terms such as "below" or "above" or "upper" or "lower" or "horizontal" or "lateral" or "vertical" may be used herein to describe a relationship of one element, layer or region to another element, layer or region as illustrated in the figures.

Transistor structures with features that may be used in embodiments of the present inventive concepts are disclosed in the following commonly assigned publications, the contents of each of which are fully incorporated by reference herein in their entirety: U.S. Pat. No. 6,849,882 to Chavarkar et al. and entitled "Group-III Nitride Based High Electron Mobility Transistor (HEMT) With Barrier/Spacer Layer"; U.S. Pat. No. 7,230,284 to Parikh et al. and entitled "Insulating Gate AlGaN/GaN HEMT"; U.S. Pat. No. 7,501,669 to Parikh et al. and entitled "Wide Bandgap Transistor Devices With Field Plates"; U.S. Pat. No. 7,126,426 to Mishra et al. and entitled "Cascode Amplifier Structures Including Wide Bandgap Field Effect Transistor With Field Plates"; U.S. Pat. No. 7,550,783 to Wu et al. and entitled "Wide Bandgap HEMTs With Source Connected Field Plates"; U.S. Pat. No. 7,573,078 to Wu et al. and entitled "Wide Bandgap Transistors With Multiple Field Plates"; U.S. Pat. Pub. No. 2005/0253167 to Wu et al. and entitled "Wide Bandgap Field Effect Transistors With Source Connected Field Plates"; U.S. Pat. Pub. No. 2006/0202272 to Wu et al. and entitled "Wide Bandgap Transistors With Gate-Source Field Plates"; U.S. Pat. Pub. No. 2008/0128752 to Wu and entitled "GaN Based HEMTs With Buried Field Plates"; U.S. Pat. Pub. No. 2010/0276698 to Moore et al. and entitled "Gate Electrodes For Millimeter-Wave Operation and Methods of Fabrication; U.S. Pat. Pub. No. 2012/0049973 to Smith, Jr. et al. and entitled "High Power Gallium Nitride Field Effect Transistor Switches"; U.S. Pat. Pub. No. 2012/0194276 to Fisher and entitled "Low Noise Amplifiers Including Group III Nitride Based High Electron Mobility Transistors"; and U.S. Pat. No. 9,847,411 to Sriram et al. entitled "Recessed field plate transistor structures."

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the inventive concepts should not be limited to the specific embodiments described above.

What is claimed is:

1. A transistor device, comprising:
a substrate;
a channel layer formed on the substrate;
a barrier layer on the channel layer; and
a source contact and a drain contact on the barrier layer, and a gate contact that terminates on a surface of the barrier layer between the source and drain contacts;
wherein the channel layer comprises a first sub-layer, a second sub-layer on the first sub-layer, and a third sub-layer on the second sub-layer, wherein the first sub-layer is between the second sub-layer and the substrate and the second sub-layer is between the first sub-layer and the third sub-layer;
wherein the first sub-layer is doped with n-type dopants at a first doping concentration, the second sub-layer is doped with n-type dopants at a second doping concentration, and the third sub-layer is doped with n-type dopants at a third doping concentration, wherein the second doping concentration is greater than the first doping concentration.

2. The transistor device of claim 1, wherein the second sub-layer has a thickness between 50 and 150 nm.

3. The transistor device of claim 2, wherein the second sub-layer has a thickness of about 100 nm.

4. The transistor device of claim 1, wherein the first sub-layer has a thickness greater than the second sub-layer.

5. The transistor device of claim 4, wherein the first sub-layer has a thickness of about 100 nm.

6. The transistor device of claim 1, wherein the second sub-layer is doped with an n-type dopant having a doping concentration level greater than 2E16 $cm^3$.

7. The transistor device of claim 6, wherein the first sub-layer is doped with an n-type dopant having a doping concentration level less than 2E16 $cm^{-3}$.

8. The transistor device of claim 1, wherein the n-type dopant in the second sub-layer comprises silicon.

9. The transistor device of claim 1, wherein the doping concentration level of the n-type dopant in the second sub-layer is between about 2E16 cm$^{-3}$ and 4E16 cm$^{-3}$.

10. The transistor device of claim 1, wherein the doping concentration level of the n-type dopant in the second sub-layer is about 3E16 cm$^{-3}$.

11. The transistor device of claim 1, wherein the doping concentration level of the n-type dopant in the first sub-layer is about 1E16 cm$^{-3}$.

12. The transistor device of claim 1, wherein the doping concentration level of the n-type dopant in the first sub-layer is below about 2E16 cm$^{-3}$.

13. The transistor device of claim 1, wherein the channel layer has a total thickness of about 500 nm or less.

14. The transistor device of claim 1, wherein the barrier layer and the channel layer cooperate to induce a two-dimensional electron gas (2DEG) in the channel layer.

15. The transistor device of claim 1, wherein the channel layer comprises GaN.

16. The transistor device of claim 1, wherein the third doping concentration is lower than the second doping concentration.

17. The transistor device of claim 16, wherein the first sub-layer has a thickness greater than a thickness of the second sub-layer and greater than a thickness of the third sub-layer.

18. A transistor device, comprising:
a substrate;
a channel layer on the substrate;
a barrier layer on the channel layer; and
source and drain contacts on the barrier layer, and a gate contact that terminates on a surface of the barrier layer between the source and drain contacts;
wherein the channel layer comprises a first sub-layer having a first doping concentration level, a second sub-layer having a second doping concentration level on the first sub-layer, and a third sub-layer having a third doping concentration level on the second sub-layer opposite the first sub-layer, wherein the third sub-layer is adjacent the barrier layer, and wherein the first sub-layer is between the second sub-layer and the substrate, wherein each of the first sub-layer, the second sub-layer, and the third sub-layer is doped with an n-type dopant;
wherein the second doping concentration level is higher than the first doping concentration level and the third doping concentration level,
wherein the second doping concentration level is greater than 2E16 cm$^{-3}$, and
wherein the first and third doping concentration levels are each less than about 2E16 cm$^{-3}$.

19. The transistor device of claim 18, wherein the second doping concentration level is between about 2E16 cm$^{-3}$ and 4E16 cm$^{-3}$.

20. The transistor device of claim 19, wherein the first and third doping concentration levels are each about 1E16 cm$^3$, and wherein the second doping concentration level is about 3E16 cm$^{-3}$.

21. The transistor device of claim 18, wherein the first and second sub-layers each have a thickness between about 50 nm and 150 nm.

* * * * *